(12) United States Patent
Kajiwara et al.

(10) Patent No.: US 11,329,135 B2
(45) Date of Patent: May 10, 2022

(54) SEMICONDUCTOR DEVICE

(71) Applicant: KABUSHIKI KAISHA TOSHIBA, Tokyo (JP)

(72) Inventors: Yosuke Kajiwara, Yokohama (JP); Masahiko Kuraguchi, Yokohama (JP); Akira Mukai, Kawasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 2 days.

(21) Appl. No.: 17/013,959

(22) Filed: Sep. 8, 2020

(65) Prior Publication Data

US 2021/0184007 A1 Jun. 17, 2021

(30) Foreign Application Priority Data

Dec. 16, 2019 (JP) ............................. JP2019-226743

(51) Int. Cl.
*H01L 29/51* (2006.01)
*H01L 29/20* (2006.01)
(Continued)

(52) U.S. Cl.
CPC .... *H01L 29/41775* (2013.01); *H01L 29/2003* (2013.01); *H01L 29/2006* (2013.01); *H01L 29/42316* (2013.01); *H01L 29/47* (2013.01); *H01L 29/51* (2013.01); *H01L 29/7786* (2013.01)

(58) Field of Classification Search
CPC combination set(s) only.
See application file for complete search history.

(56) References Cited

U.S. PATENT DOCUMENTS 7,304,331 B2  12/2007  Saito et al.
9,252,254 B2   2/2016  Shimizu et al.
(Continued)

FOREIGN PATENT DOCUMENTS

JP    2006-32552 A    2/2006
JP   2010-232610 A   10/2010
(Continued)

*Primary Examiner* — Julio J Maldonado
*Assistant Examiner* — Mohammad A Rahman
(74) *Attorney, Agent, or Firm* — Oblon, McClelland, Maier & Neustadt, L.L.P.

(57) ABSTRACT

According to one embodiment, a semiconductor device includes first, second and third electrodes, first and second semiconductor layers, first and second insulating members, and a first member. The third electrode includes a first electrode portion. The first electrode portion is between the first and second electrodes. The first semiconductor layer includes first, second, third, fourth, and fifth partial regions. The fourth partial region is between the first and third partial regions. The fifth partial region is between the third and second partial regions. The first insulating member includes first and second insulating regions. The second insulating member includes first and second insulating portions. The first insulating portion is between the fourth partial region and the first insulating region. The second insulating portion is between the fifth partial region and the second insulating region. The second semiconductor layer includes first, second, and third semiconductor portions.

21 Claims, 3 Drawing Sheets

(51) Int. Cl.
  *H01L 29/47* (2006.01)
  *H01L 29/778* (2006.01)
  *H01L 29/40* (2006.01)
  *H01L 29/417* (2006.01)
  *H01L 29/423* (2006.01)

(56) References Cited

U.S. PATENT DOCUMENTS

| | | |
|---|---|---|
| 2014/0335666 A1 | 11/2014 | Koehler et al. |
| 2018/0026099 A1 | 1/2018 | Miyamoto et al. |
| 2018/0374942 A1* | 12/2018 | Hikosaka ............ H01L 29/7786 |
| 2019/0386127 A1* | 12/2019 | Kato .................... H01L 29/4236 |
| 2020/0027976 A1 | 1/2020 | Mukai et al. |

FOREIGN PATENT DOCUMENTS

| | | |
|---|---|---|
| JP | 5720678 B2 | 5/2015 |
| JP | 2018-18848 A | 2/2018 |
| JP | 2020-17577 A | 1/2020 |

* cited by examiner

SEMICONDUCTOR DEVICE

CROSS-REFERENCE TO RELATED APPLICATIONS

This application is based upon and claims the benefit of priority from Japanese Patent Application No. 2019-226743, filed on Dec. 16, 2019; the entire contents of which are incorporated herein by reference.

FIELD

Embodiments of the invention generally relate to a semiconductor device.

BACKGROUND

For example, it is desirable to improve the characteristics of a semiconductor device such as a transistor or the like.

DETAILED DESCRIPTION

Figure 1:
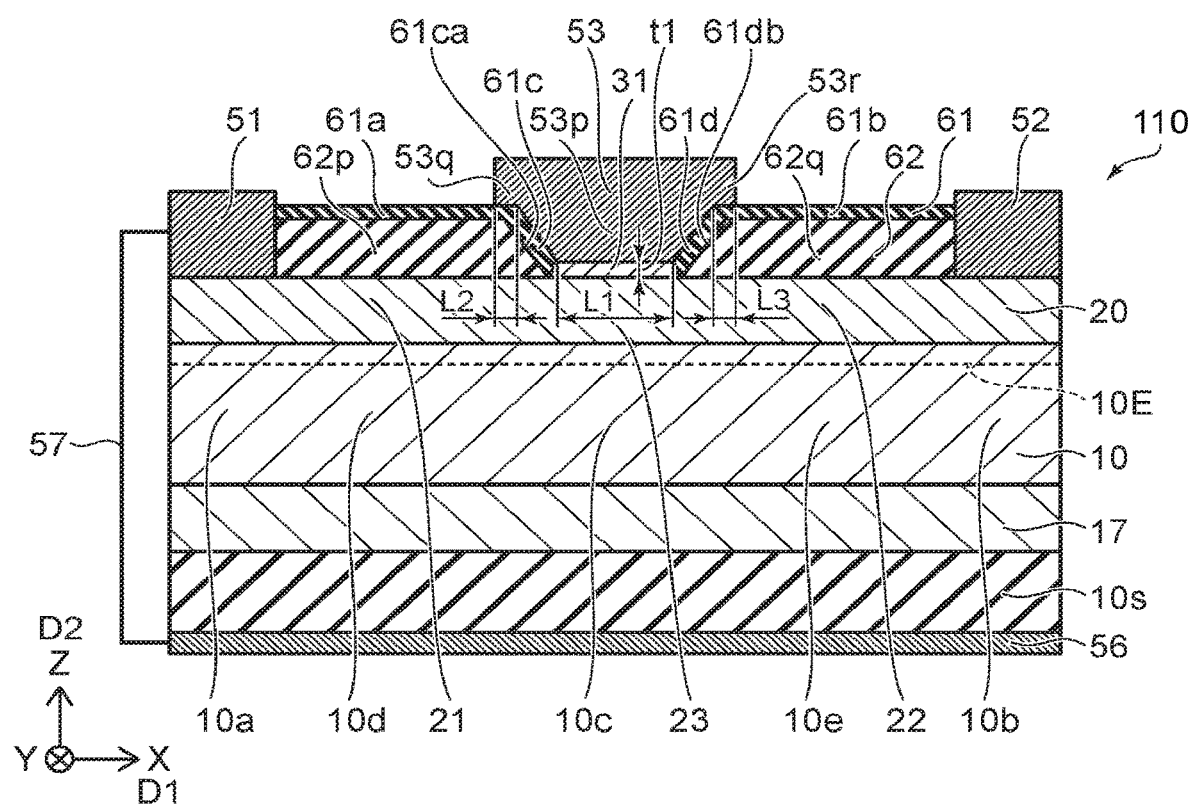
FIG. 1 is a schematic cross-sectional view illustrating a semiconductor device according to a first embodiment.

According to one embodiment, a semiconductor device includes a first electrode, a second electrode, a third electrode, a first semiconductor layer, a first insulating member, a second insulating member, a second semiconductor layer, and a first member. A direction from the first electrode toward the second electrode is along a first direction. The third electrode includes a first electrode portion. A position in the first direction of the first electrode portion is between a position in the first direction of the first electrode and a position in the first direction of the second electrode. The first semiconductor layer includes $Al_{x1}Ga_{1-x1}N$ ($0 \leq x1 < 1$). The first semiconductor layer includes a first partial region, a second partial region, a third partial region, a fourth partial region, and a fifth partial region. A second direction from the first partial region toward the first electrode crosses the first direction. A direction from the second partial region toward the second electrode is along the second direction. A direction from the third partial region toward the first electrode portion is along the second direction. The fourth partial region is between the first partial region and the third partial region in the first direction. The fifth partial region is between the third partial region and the second partial region in the first direction. The first insulating member includes a first insulating region and a second insulating region. The first insulating member includes Al and nitrogen. At least a portion of the first insulating member is amorphous. The second insulating member includes a first insulating portion and a second insulating portion. The first insulating portion is between the fourth partial region and the first insulating region in the second direction. The second insulating portion is between the fifth partial region and the second insulating region in the second direction. The second insulating portion includes silicon and nitrogen. The second semiconductor layer includes $Al_{x2}Ga_{1-x2}N$ ($0 < x2 \leq 1$ and $x1 < x2$). The second semiconductor layer includes a first semiconductor portion, a second semiconductor portion, and a third semiconductor portion. The first semiconductor portion is between the fourth partial region and the first insulating portion in the second direction. The second semiconductor portion is between the fifth partial region and the second insulating portion in the second direction. The third semiconductor portion is between the third partial region and the first electrode portion in the second direction. The first member includes a crystal including $Al_{x3}Ga_{1-x3}N$ ($0 < x3 \leq 1$ and $x2 < x3$). The first member is between the third semiconductor portion and the first electrode portion in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor layer 10, a second semiconductor layer 20, a first insulating member 61, a second insulating member 62, and a first member 31.

The direction from the first electrode 51 toward the second electrode 52 is along a first direction D1. The first direction D1 is, for example, an X-axis direction. One direction perpendicular to the X-axis direction is taken as a Z-axis direction. A direction perpendicular to the X-axis direction and the Z-axis direction is taken as a Y-axis direction.

The third electrode 53 includes a first electrode portion 53p. The position in the first direction D1 of the first electrode portion 53p is between the position in the first direction D1 of the first electrode 51 and the position in the first direction D1 of the second electrode 52. For example, the third electrode 53 is between the first electrode 51 and the second electrode 52 in the first direction D1.

The first semiconductor layer 10 includes $Al_{x1}Ga_{1-x1}N$ ($0 \leq x1 < 1$). The Al composition ratio in the first semiconductor layer 10 is, for example, not less than 0 and not more than 0.05. The first semiconductor layer 10 includes, for example, GaN.

The first semiconductor layer 10 includes a first partial region 10a, a second partial region 10b, a third partial region 10c, a fourth partial region 10d, and a fifth partial region 10e. A second direction D2 from the first partial region 10a toward the first electrode 51 crosses the first direction D1. The second direction D2 is, for example, the Z-axis direction. For example, the first semiconductor layer 10 spreads parallel to the X-Y plane.

The direction from the second partial region 10b toward the second electrode 52 is along the second direction D2. The direction from the third partial region 10c toward the first electrode portion 53p is along the second direction D2. The fourth partial region 10d is between the first partial region 10a and the third partial region 10c in the first direction D1. The fifth partial region 10e is between the third partial region 10c and the second partial region 10b in the first direction D1.

The first insulating member 61 includes a first insulating region 61a and a second insulating region 61b. The first insulating member 61 includes Al and nitrogen. At least a portion of the first insulating member 61 is amorphous. The first insulating member 61 includes, for example, amorphous AlN. As described below, the first insulating member 61 may further include another element such as oxygen, etc.

The second insulating member 62 includes a first insulating portion 62p and a second insulating portion 62q. The first insulating portion 62p is between the fourth partial region 10d and the first insulating region 61a in the second direction D2.

The second insulating portion 62q is between the fifth partial region 10e and the second insulating region 61b in the second direction D2. The second insulating member 62 includes, for example, silicon and nitrogen. The second insulating member 62 includes, for example, SiN (e.g., $Si_3N_4$). The second insulating member 62 may have a stacked structure including multiple films that include silicon and nitrogen with mutually-different compositions. The second insulating member 62 may be, for example, a stacked body including a Si-rich SiN film and a N-rich SiN film. For example, low current collapse and low current leakage are obtained by such a stacked structure (or stacked body). A highly reliable semiconductor device is obtained.

The second semiconductor layer 20 includes $Al_{x2}Ga_{1-x2}N$ ($0<x2\leq1$ and $x1<x2$). The Al composition ratio in the second semiconductor layer 20 is not less than 0.05 and not more than 0.35. The second semiconductor layer 20 includes AlGaN.

The second semiconductor layer 20 includes a first semiconductor portion 21, a second semiconductor portion 22, and a third semiconductor portion 23. The first semiconductor portion 21 is between the fourth partial region 10d and the first insulating portion 62p in the second direction D2. The second semiconductor portion 22 is between the fifth partial region 10e and the second insulating portion 62q in the second direction D2. The third semiconductor portion 23 is between the third partial region 10c and the first electrode portion 53p in the second direction D2.

The first member 31 includes a crystal including $Al_{x3}Ga_{1-x3}N$ ($0<x3\leq1$ and $x2<x3$). The Al composition ratio in the first member 31 is, for example, 0.8 or more. The first member 31 may include, for example, AlN. The first member 31 is between the third semiconductor portion 23 and the first electrode portion 53p in the second direction D2. The first member 31 includes a crystal.

Information that relates to the crystalline state of the first member 31 and information that relates to the amorphous state of the first insulating member 61 are obtained by, for example, electron microscopy, an X-ray diffraction image, etc.

For example, a substrate 10s is provided as shown in FIG. 1. The substrate 10s may be, for example, a SiC substrate. The substrate 10s may be a silicon substrate. A buffer layer 17 may be provided on the substrate 10s as necessary. The buffer layer 17 includes, for example, a nitride semiconductor. For example, the first semiconductor layer 10 is provided on the substrate 10s (e.g., on the buffer layer 17). The second semiconductor layer 20 is provided on the first semiconductor layer 10. The first electrode 51 and the second electrode 52 are provided on portions of the second semiconductor layer 20. The first member 31 is provided on a portion of the second semiconductor layer 20. The third electrode 53 is provided on the first member 31.

The first insulating portion 62p is provided on the second semiconductor layer 20 between the first electrode 51 and the third electrode 53. The first insulating region 61a is provided on the first insulating portion 62p. The second insulating portion 62q is provided on the second semiconductor layer 20 between the third electrode 53 and the second electrode 52. The second insulating region 61b is provided on the second insulating portion 62q.

In one example in which the substrate 10s is insulative, a conductive layer 56 may be provided at the lower surface of the substrate 10s. The conductive layer 56 is electrically connected to the first electrode 51. For example, the electrical connection is performed by an interconnect 57, etc.

A carrier region 10E is formed in a portion of the first semiconductor layer 10 at the second semiconductor layer 20 side. The carrier region 10E is, for example, a two-dimensional electron gas. A current that flows between the first electrode 51 and the second electrode 52 is controllable by changing the potential of the third electrode 53. The first electrode 51 is, for example, a source electrode. The second electrode 52 is, for example, a drain electrode. The third electrode 53 is, for example, a gate electrode. The semiconductor device 110 is, for example, a HEMT (High Electron Mobility Transistor). The semiconductor device 110 is, for example, a normally-on semiconductor device.

The crystalline first member 31 is provided in the embodiment. The carrier density of the carrier region 10E under the third electrode 53 is increased thereby. A large maximum output current is obtained thereby. According to the embodiment, a semiconductor device can be provided in which the characteristics can be improved.

According to experiments by the inventor, the carrier density when the first member 31 is a crystal is 1.5 times the carrier density when a member corresponding to the first member 31 is amorphous. According to the embodiment, for example, 1.5 times the maximum output current is obtained.

In the embodiment, the amorphous first insulating region 61a is provided in a portion between the first electrode 51 and the third electrode 53. The amorphous second insulating region 61b is provided in a portion between the second electrode 52 and the third electrode 53. For example, the unintended penetration of an element from the outside into at least one of the second insulating member 62 or the second semiconductor layer 20 can be suppressed by the first insulating region 61a and the second insulating region 61b. The unintended element is, for example, hydrogen. For example, the hydrogen is trapped at the interface between the first insulating member 61 and the second insulating member 62. The hydrogen concentration in the second insulating member 62 can be reduced.

For example, the leakage current can be suppressed by suppressing the introduction of the unintended element (e.g., hydrogen). The fluctuation of the device characteristics can be suppressed. For example, high reliability is obtained.

For example, when the first insulating member 61 includes a crystal, a leakage current that is caused by the grain boundaries of the crystal flows easily. The leakage current can be suppressed when the first insulating member 61 is amorphous. According to the embodiment, a high carrier density is obtained while suppressing the leakage current.

In the embodiment, for example, the first member 31 contacts the first electrode portion 53p. For example, the first electrode portion 53p has a Schottky contact with the first member 31. The third electrode 53 includes, for example, at least one selected from the group consisting of Ni, Au, Pt, W, Al, Ta, and Ti. A Schottky contact is easily obtained thereby.

On the other hand, for example, the first member 31 contacts the third semiconductor portion 23. For example, the first member 31 can be formed on the third semiconductor portion 23 by ALD (Atomic Layer Deposition). For example, the film that is used to form the first member 31 and the first insulating member 61 is formed by a method such as ALD, etc. The portion that is provided on the crystalline third semiconductor portion 23 is used to form the first member 31. The portion that is provided on the amorphous second insulating member 62 is used to form the first insulating member 61.

It is favorable for a thickness t1 along the second direction D2 of the first member 31 (referring to FIG. 1) to be not less than 0.5 nm and not more than 10 nm. By setting the thickness t1 to be 0.5 nm or more, the carrier concentration can be effectively increased. By setting the thickness t1 to be 10 nm or less, the gate capacitance can be reduced, and a good high frequency gain is easily obtained. In the embodiment, the thickness t1 may be not less than 4 nm and not more than 10 nm. The carrier concentration can be more effectively increased. A good high frequency gain is more easily obtained.

In the embodiment, a length L1 along the first direction D1 of the first electrode portion 53p (referring to FIG. 1) is, for example, 0.1 μm or more. A semiconductor device that has low characteristic fluctuation is easily obtained thereby. The length L1 is, for example, 1 μm or less. Good high frequency characteristics are easily obtained thereby.

As shown in FIG. 1, the first insulating member 61 may further include a third insulating region 61c. The third insulating region 61c is between the first insulating portion 62p and a portion of the first electrode portion 53p in the first direction D1. The third insulating region 61c is a side portion of the first insulating member 61.

For example, the third insulating region 61c includes a first side surface 61ca. The first side surface 61ca faces the first insulating portion 62p in the first direction D1. In the example, the first side surface 61ca is oblique to the first and second directions D1 and D2. For example, the side surface of the first insulating portion 62p is oblique, and the first side surface 61ca is provided on the side surface. The third insulating region 61c that includes the first side surface 61ca also is amorphous. The leakage current at the side surface portion of the first insulating portion 62p also can be suppressed thereby. For example, the unintended elements such as hydrogen, etc., can be trapped also at the interface between the first side surface 61ca and the first insulating portion 62p. The surface area of the interface can be large because the interface is oblique. The unintended elements are easily and efficiently trapped because the interface has a large surface area. Because the interface is oblique, a film that has a uniform film thickness and uniform film properties is easily obtained at the first side surface 61ca.

As shown in FIG. 1, the first insulating member 61 may further include a fourth insulating region 61d. The fourth insulating region 61d is between the second insulating portion 62q and a portion of the first electrode portion 53p in the first direction D1. For example, the fourth insulating region 61d includes a second side surface 61db. The second side surface 61db faces the second insulating portion 62q in the first direction D1. In the example, for example, the second side surface 61db is oblique to the first and second directions D1 and D2. The fourth insulating region 61d that includes the second side surface 61db also is amorphous. The leakage current can be effectively suppressed. The unintended elements are easily and efficiently trapped. Because the interface is oblique, a film that has a uniform film thickness and uniform film properties is easily obtained at the first side surface 61ca. Because the interface is oblique, a locally-concentrated electric field due to intense electric field stress from the second electrode 52 can be relaxed at the side surface edge. For example, high reliability is obtained.

As shown in FIG. 1, the third electrode 53 may further include a second electrode portion 53q and a third electrode portion 53r. A portion of the first insulating region 61a of the first insulating member 61 is between the first insulating portion 62p and the second electrode portion 53q in the second direction D2. A portion of the second insulating region 61b of the first insulating member 61 is between the second insulating portion 62q and the third electrode portion 53r in the second direction D2.

A portion of the first insulating portion 62p at the third electrode 53 side is covered with the second electrode portion 53q of the third electrode 53. A portion of the second insulating portion 62q at the third electrode 53 side is covered with the third electrode portion 53r of the third electrode 53. The penetration of the unintended elements (e.g., hydrogen, etc.) into these portions can be more effectively suppressed thereby. For example, the leakage current can be more effectively suppressed. It is desirable for at least one of a length L2 in the first direction D1 of the second electrode portion 53q or a length L3 in the first direction D1 of the third electrode portion 53r to be 0.2 μm or less. Thereby, for example, the gate capacitance can be suppressed, and good high frequency characteristics are easily obtained.

In the embodiment, the first insulating member 61 may further include oxygen in addition to Al and nitrogen. A higher hydrogen trapping efficiency is obtained thereby. The transmission of hydrogen by the first insulating member 61 can be further suppressed. The leakage current can be further suppressed. The oxygen concentration in the first insulating member 61 is, for example, 5% or more. The leakage current can be more effectively suppressed.

In the embodiment, the first insulating member 61 may further include silicon in addition to Al, nitrogen, and oxygen. A higher hydrogen trapping efficiency is obtained thereby. The transmission of hydrogen by the first insulating member 61 can be further suppressed. The leakage current can be further suppressed. The silicon concentration in the first insulating member 61 is, for example, 5% or more. The leakage current can be more effectively suppressed.

Second Embodiment

Figure 2:
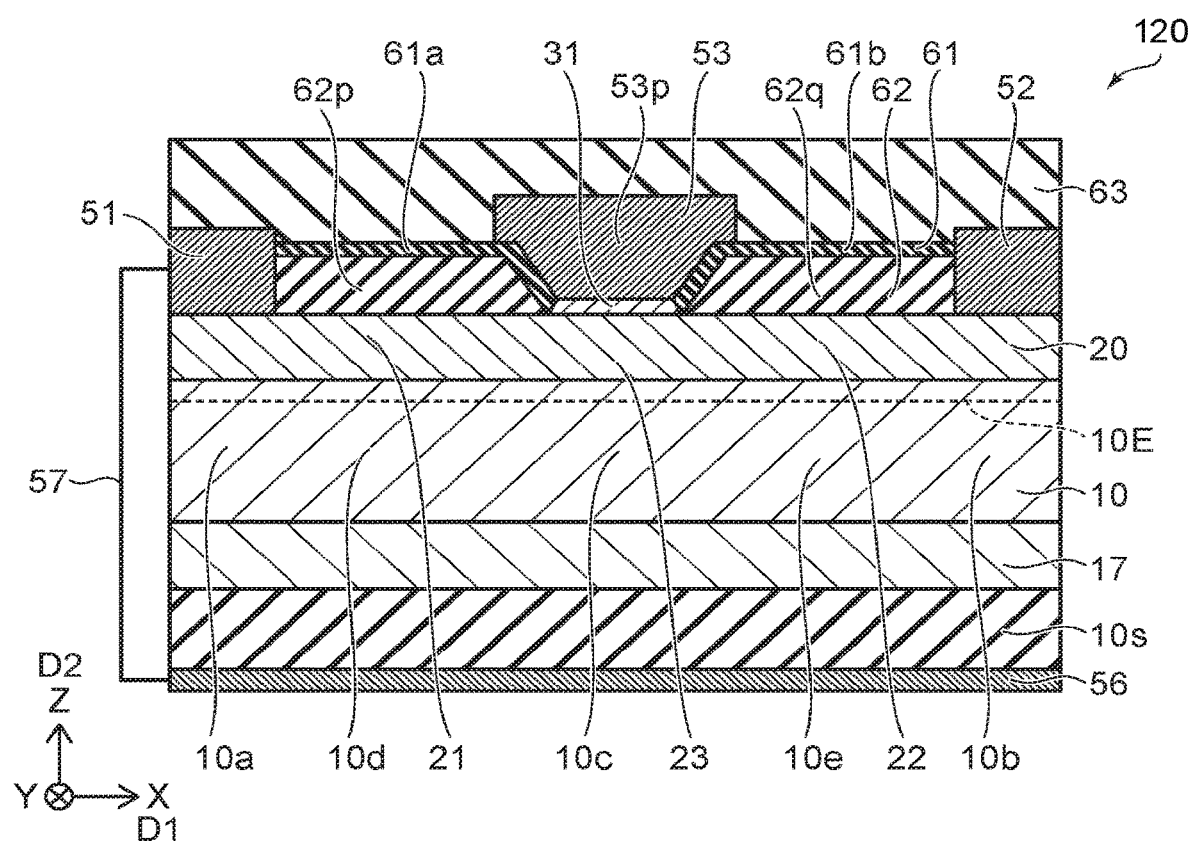
FIG. 2 is a schematic cross-sectional view illustrating a semiconductor device according to a second embodiment.

FIG. 2 is a schematic cross-sectional view illustrating a semiconductor device according to a second embodiment.

As shown in FIG. 2, the semiconductor device 120 according to the embodiment further includes a third insulating member 63 in addition to the first electrode 51, the second electrode 52, the third electrode 53, the first semiconductor layer 10, the second semiconductor layer 20, the first insulating member 61, the second insulating member 62, and the first member 31. The configurations of the first electrode 51, the second electrode 52, the third electrode 53, the first semiconductor layer 10, the second semiconductor layer 20, the first insulating member 61, the second insulating member 62, and the first member 31 of the semiconductor device 120 are applicable to those of the semiconductor device 110. An example of the third insulating member 63 will now be described.

The first electrode portion 53p is between the first member 31 and at least a portion of the third insulating member 63 in the second direction D2. The third insulating member 63 may cover at least a portion of the first electrode 51, at least a portion of the second electrode 52, and at least a portion of the third electrode 53. For example, the third insulating member 63 functions as a passivation layer.

The third insulating member 63 includes silicon and at least one selected from the group consisting of nitrogen and oxygen. The third insulating member 63 includes, for example, SiN (e.g., $Si_3N_4$). The third insulating member 63 includes, for example, $SiO_2$. The third insulating member 63 includes, for example, SiON. High reliability is obtained by providing the third insulating member 63.

Hydrogen easily diffuses toward the semiconductor layers when forming the third insulating member 63. In the embodiment, the diffusion of hydrogen can be effectively suppressed by providing the first insulating member 61.

Third Embodiment

Figure 3:
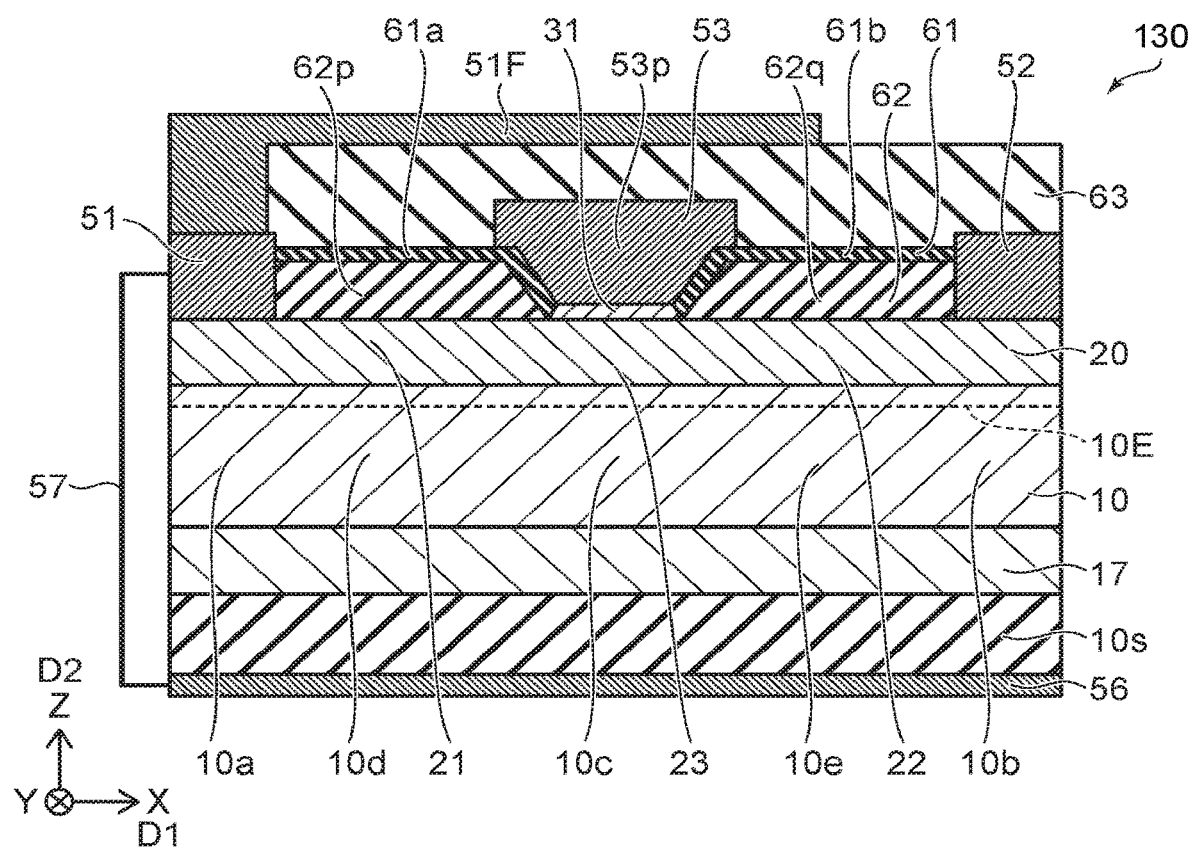
FIG. 3 is a schematic cross-sectional view illustrating a semiconductor device according to a third embodiment.

FIG. 3 is a schematic cross-sectional view illustrating a semiconductor device according to a third embodiment.

As shown in FIG. 3, the semiconductor device 130 according to the embodiment further includes a conductive member 51F in addition to the first electrode 51, the second electrode 52, the third electrode 53, the first semiconductor layer 10, the second semiconductor layer 20, the first insulating member 61, the second insulating member 62, the first member 31, and the third insulating member 63. The configurations of the first electrode 51, the second electrode 52, the third electrode 53, the first semiconductor layer 10, the second semiconductor layer 20, the first insulating member 61, the second insulating member 62, the first member 31, and the third insulating member 63 of the semiconductor device 130 are applicable to those of the semiconductor device 120. An example of the conductive member 51F will now be described.

The conductive member 51F is electrically connected to the first electrode 51. At least a portion of the third insulating member 63 is between the first electrode portion 53p and at least a portion of the conductive member 51F. For example, the conductive member 51F functions as a field plate. The electric field concentration on the edge of the gate electrode 53 can be relaxed. High reliability is obtained due to the conductive member 51F, for example. For example, good frequency characteristics are easily obtained due to the conductive member 51F.

According to the embodiments, a semiconductor device can be provided in which the characteristics can be improved.

In the embodiments, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first electrode;
a second electrode, a direction from the first electrode toward the second electrode being along a first direction;
a third electrode including a first electrode portion, a position in the first direction of the first electrode portion being between a position in the first direction of the first electrode and a position in the first direction of the second electrode;
a first semiconductor layer including $Al_{x1}Ga_{1-x1}N$ ($0 \leq x1 < 1$), the first semiconductor layer including a first partial region, a second partial region, a third partial region, a fourth partial region, and a fifth partial region, a second direction from the first partial region toward the first electrode crossing the first direction, a direction from the second partial region toward the second electrode being along the second direction, a direction from the third partial region toward the first electrode portion being along the second direction, the fourth partial region being between the first partial region and the third partial region in the first direction, the fifth partial region being between the third partial region and the second partial region in the first direction;
a first insulating member including a first insulating region and a second insulating region, the first insulating member including Al and nitrogen, at least a portion of the first insulating member being amorphous;
a second insulating member including a first insulating portion and a second insulating portion, the first insulating portion being between the fourth partial region and the first insulating region in the second direction, the second insulating portion being between the fifth partial region and the second insulating region in the second direction, the second insulating portion including silicon and nitrogen;

a second semiconductor layer including $Al_{x2}Ga_{1-x2}N$ ($0<x2\leq1$ and $x1<x2$), the second semiconductor layer including a first semiconductor portion, a second semiconductor portion, and a third semiconductor portion, the first semiconductor portion being between the fourth partial region and the first insulating portion in the second direction, the second semiconductor portion being between the fifth partial region and the second insulating portion in the second direction, the third semiconductor portion being between the third partial region and the first electrode portion in the second direction; and a first member including a crystal including $Al_{x3}Ga_{1-x3}N$ ($0<x3\leq1$ and $x2<x3$), the first member being between the third semiconductor portion and the first electrode portion in the second direction.

2. The device according to claim 1, wherein the first member contacts the first electrode portion.

3. The device according to claim 1, wherein the first electrode portion has a Schottky contact with the first member.

4. The device according to claim 1, wherein the first member contacts the third semiconductor portion.

5. The device according to claim 1, wherein the first insulating member further includes a third insulating region, and
the third insulating region is between the first insulating portion and a portion of the first electrode portion in the first direction.

6. The device according to claim 5, wherein the first insulating member further includes a fourth insulating region, and
the fourth insulating region is between the second insulating portion and the portion of the first electrode portion in the first direction.

7. The device according to claim 6, wherein the fourth insulating region includes a second side surface facing the second insulating portion in the first direction, and
the second side surface is oblique to the first and second directions.

8. The device according to claim 5, wherein the third insulating region includes a first side surface facing the first insulating portion in the first direction, and
the first side surface is oblique to the first and second directions.

9. The device according to claim 1, wherein
the third electrode further includes a second electrode portion and a third electrode portion,
a portion of the first insulating region is between the first insulating portion and the second electrode portion in the second direction, and
a portion of the second insulating region is between the second insulating portion and the third electrode portion in the second direction.

10. The device according to claim 9, wherein
at least one of a length along the first direction of the second electrode portion or a length along the first direction of the third electrode portion is 0.2 μm or less.

11. The device according to claim 1, wherein
a thickness along the second direction of the first member is not less than 0.5 nm and not more than 10 nm.

12. The device according to claim 1, wherein
the first insulating member further includes oxygen.

13. The device according to claim 12, wherein
a concentration of oxygen in the first insulating member is 5% or more.

14. The device according to claim 12, wherein
the first insulating member further includes silicon.

15. The device according to claim 14, wherein
a concentration of silicon in the first insulating member is 5% or more.

16. The device according to claim 1, further comprising:
a third insulating member,
the first electrode portion being between the first member and at least a portion of the third insulating member in the second direction.

17. The device according to claim 16, wherein
the third insulating member includes silicon and at least one selected from the group consisting of nitrogen and oxygen.

18. The device according to claim 16, further comprising:
a conductive member electrically connected to the first electrode,
the at least a portion of the third insulating member being between the first electrode portion and at least a portion of the conductive member.

19. The device according to claim 1, wherein
a length along the first direction of the first electrode portion is 1 μm or less.

20. The device according to claim 1, wherein
the third electrode includes at least one selected from the group consisting of Ni, Au, Pt, W, Ta, Al, and Ti.

21. The device according to claim 1, wherein a composition ratio of Al in the first member is 0.8 or more.

* * * * *